United States Patent
Choi et al.

(10) Patent No.: US 11,127,949 B2
(45) Date of Patent: Sep. 21, 2021

(54) ANODE FOR LITHIUM SECONDARY BATTERY, PRODUCTION METHOD THEREFOR, AND LITHIUM SECONDARY BATTERY COMPRISING SAME

(71) Applicant: LG CHEM, LTD., Seoul (KR)

(72) Inventors: Heewon Choi, Daejeon (KR); Eun Kyung Kim, Daejeon (KR); Ki Hwan Kim, Daejeon (KR); Sangwook Woo, Daejeon (KR); Jeong Woo Shon, Daejeon (KR); Ohbyong Chae, Daejeon (KR)

(73) Assignee: LG CHEM, LTD., Seoul (KR)

( * ) Notice: Subject to any disclaimer, the term of this patent is extended or adjusted under 35 U.S.C. 154(b) by 160 days.

(21) Appl. No.: 16/491,521

(22) PCT Filed: Mar. 7, 2018

(86) PCT No.: PCT/KR2018/002703
§ 371 (c)(1),
(2) Date: Sep. 5, 2019

(87) PCT Pub. No.: WO2018/169247
PCT Pub. Date: Sep. 20, 2018

(65) Prior Publication Data
US 2020/0075942 A1 Mar. 5, 2020

(30) Foreign Application Priority Data
Mar. 15, 2017 (KR) .................. 10-2017-0032286

(51) Int. Cl.
| | |
|---|---|
| *H01M 4/40* | (2006.01) |
| *H01M 4/04* | (2006.01) |
| *H01M 4/133* | (2010.01) |
| *H01M 4/1393* | (2010.01) |
| *H01M 10/0525* | (2010.01) |
| *H01M 4/02* | (2006.01) |

(52) U.S. Cl.
CPC ......... *H01M 4/405* (2013.01); *H01M 4/0421* (2013.01); *H01M 4/133* (2013.01); *H01M 4/1393* (2013.01); *H01M 10/0525* (2013.01); *H01M 2004/027* (2013.01)

(58) Field of Classification Search
CPC .... H01M 4/405; H01M 4/133; H01M 4/1393; H01M 2004/027
See application file for complete search history.

(56) References Cited

U.S. PATENT DOCUMENTS

| | | |
|---|---|---|
| 2004/0209159 A1 | 10/2004 | Lee et al. |
| 2011/0165462 A1* | 7/2011 | Zhamu ................ H01M 4/806 429/223 |
| 2012/0295149 A1 | 11/2012 | Xie |
| 2013/0309571 A1 | 11/2013 | Yoon et al. |
| 2014/0050976 A1 | 2/2014 | Nagai |
| 2014/0272594 A1* | 9/2014 | Safont Sempere ... H01M 4/134 429/231.95 |
| 2015/0111106 A1* | 4/2015 | Son ...................... H01M 4/626 429/223 |
| 2017/0309899 A1 | 10/2017 | Son et al. |
| 2019/0020034 A1* | 1/2019 | Umetsu ............... H01M 4/5825 |

FOREIGN PATENT DOCUMENTS

| | | |
|---|---|---|
| KR | 10-2004-0090561 A | 10/2004 |
| KR | 10-508945 B1 | 8/2005 |
| KR | 10-2013-0043117 A | 4/2013 |
| KR | 10-2013-0067920 A | 6/2013 |
| KR | 10-2013-0128273 A | 11/2013 |
| KR | 10-2014-0018053 A | 2/2014 |
| KR | 10-2015-0128972 A | 11/2015 |
| KR | 10-2016-0047991 A | 5/2016 |
| KR | 10-2017-0026098 A | 3/2017 |
| WO | WO 2014/142953 A1 | 9/2014 |

OTHER PUBLICATIONS

International Search Report for PCT/KR2018/002703 (PCT/ISA/210) dated Feb. 19, 2019, with English translation.
Kim et al., "Charge-Discharge Characteristics of Physically Coated Lithium Anodes by Carbon Powders", Korean Chemical Engineering Research, vol. 49, No. 5, Oct. 2011, pp. 554-559.
Extended European Search Report, dated Jan. 2, 2020, for European Application No. 18767528.5.

* cited by examiner

Primary Examiner — Ladan Mohaddes
(74) Attorney, Agent, or Firm — Birch, Stewart, Kolasch & Birch, LLP

(57) ABSTRACT

A negative electrode including a lithium metal layer, a lithium nitride thin film layer formed on at least one surface of the lithium metal layer, and a carbon-based thin film layer formed on the lithium nitride thin film layer, a method for preparing the same, and a lithium secondary battery including the same. A lithium nitride thin film layer and a carbon-based thin film layer formed on a lithium metal layer obtains current density distribution uniformly by blocking side reactions caused by a direct contact between the lithium metal layer and an electrolyte as well as increasing a specific surface area of a negative electrode, and enhances cycle performance and reduces an overvoltage by suppressing lithium dendrite formation to improve electrochemical performance of a lithium secondary battery.

9 Claims, 4 Drawing Sheets

[Figure 1]
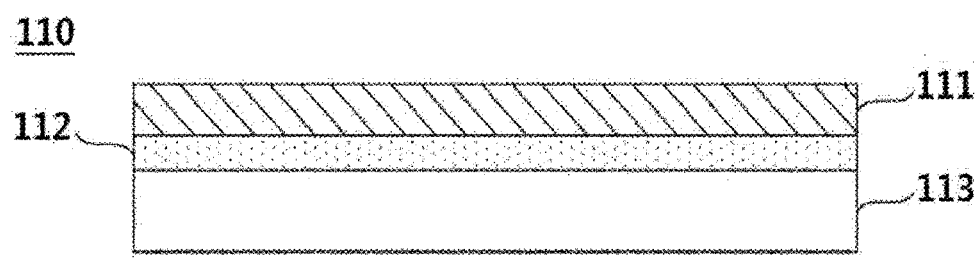
[Figure 2]
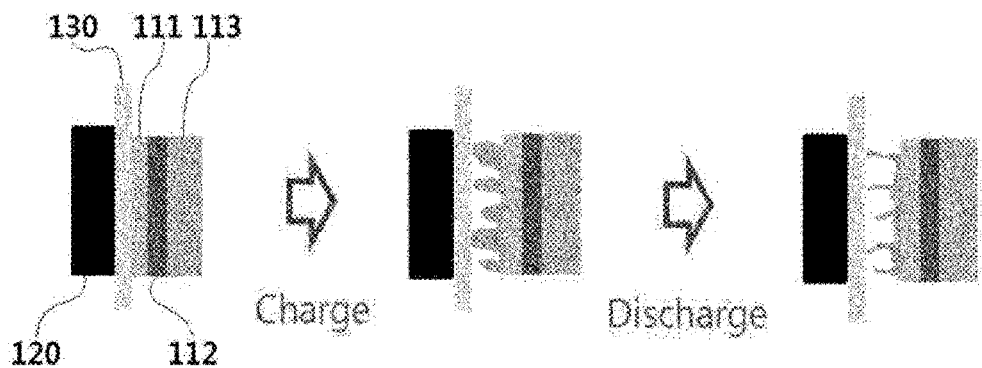

[Figure 3]
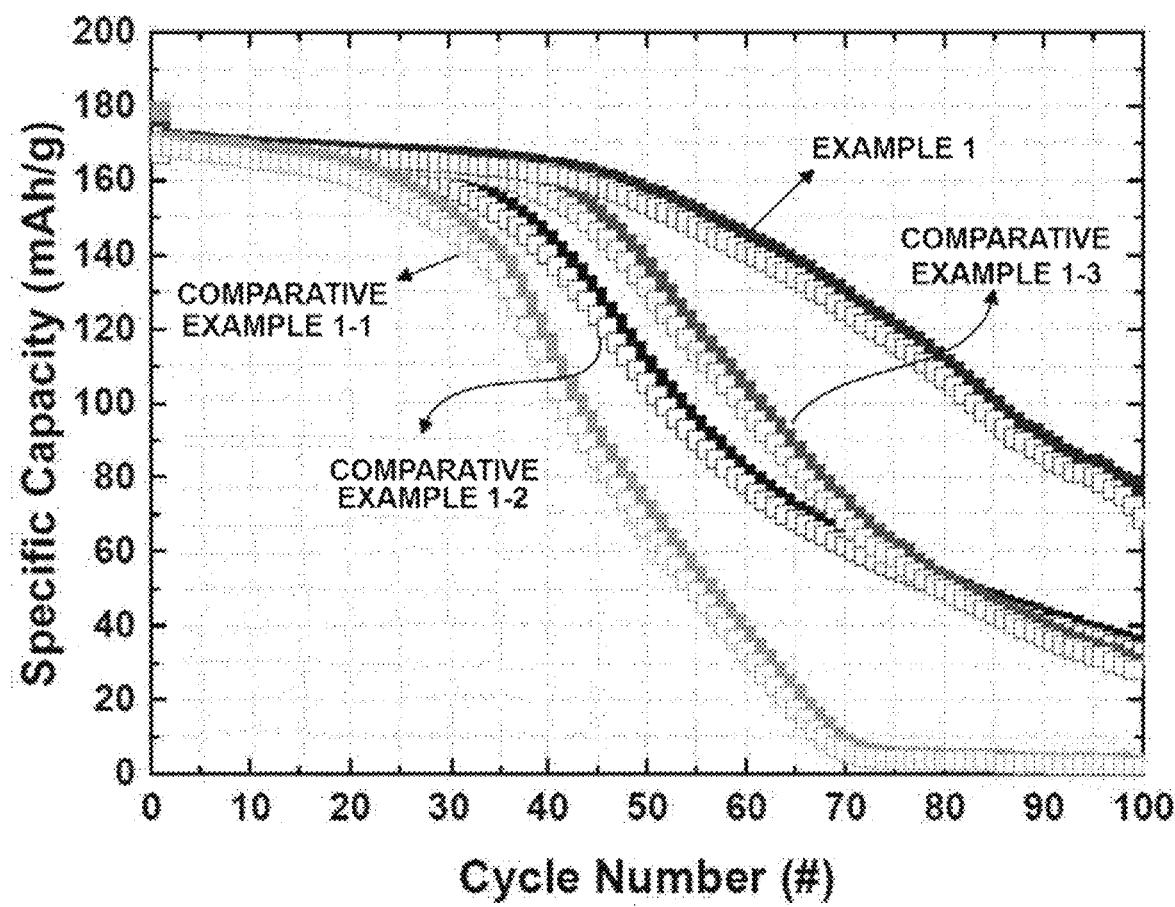

[Figure 4]
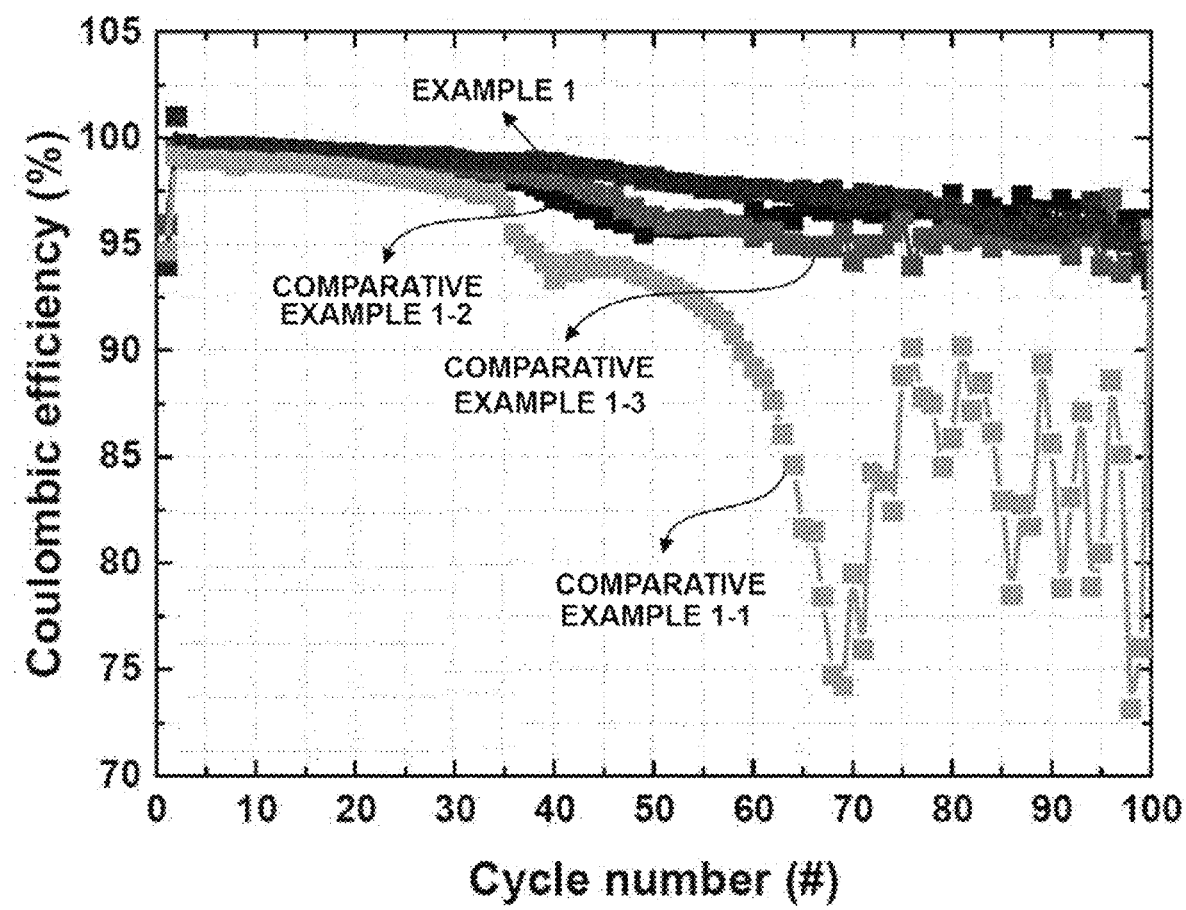

[Figure 5]
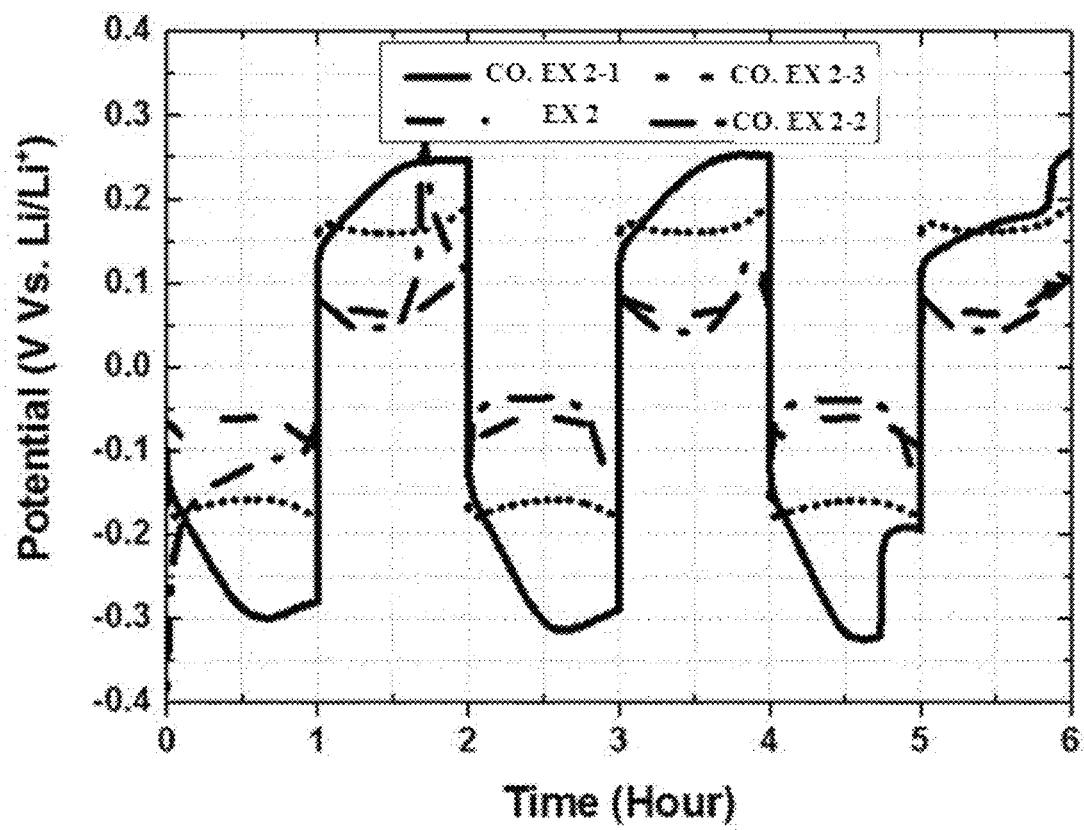

ANODE FOR LITHIUM SECONDARY BATTERY, PRODUCTION METHOD THEREFOR, AND LITHIUM SECONDARY BATTERY COMPRISING SAME

TECHNICAL FIELD

This application claims the benefits of Korean Patent Application No. 10-2017-0032286, filed on Mar. 15, 2017 with the Korean Intellectual Property Office, the disclosure of which are herein incorporated by reference in their entirety.

The present invention relates to a negative electrode for a lithium secondary battery, a method for preparing the same, and a lithium secondary battery including the same.

BACKGROUND ART

Interests in energy storage technologies have been increasingly higher recently. As applications have expanded to energy of mobile phones, camcorders and notebook PCs, and furthermore, to electric vehicles, efforts on the research and development of electrochemical devices have been more and more materialized.

Electrochemical devices are fields receiving most attention in such aspects and among these, development of secondary batteries capable of charge and discharge have been the focus of attention, and developing such batteries has been progressed to research and development on the design of new electrodes and batteries for enhancing capacity density and energy efficiency.

Among currently used secondary batteries, lithium secondary batteries developed in early 1990s have received attention with advantages of having high operating voltage and significantly higher energy density compared to conventional batteries such as Ni-MH, Ni—Cd and sulfuric acid-lead batteries using an aqueous solution electrolyte liquid.

A lithium secondary battery is generally formed by embedding an electrode assembly including a positive electrode, a negative electrode and a separator provided between the positive electrode and the negative electrode into a battery case in a laminated or wound structure, and injecting a non-aqueous electrolyte liquid thereinto. In order to use a lithium electrode as a negative electrode, lithium foil is attached on a planar current collector.

Lithium dendrite is formed due to irregular lithium formation and removal while progressing charge and discharge in a lithium secondary battery, which leads to a continuous capacity decrease. In order to resolve such issues, studies such as introducing a polymer protective layer or an inorganic solid protective layer to a lithium metal layer, increasing a concentration of a salt of a electrolyte liquid, or using proper additives have been currently progressed. However, effects of lithium dendrite suppression of such studies are insignificant. Accordingly, modifying a form of a lithium metal negative electrode itself or modifying a structure of a battery may become an effective alternative in resolving the problems.

PRIOR ART DOCUMENTS (Patent Document 1) Korean Patent Application Laid-Open Publication No. 10-2013-0067920 "Lithium secondary battery using negative electrode having carbon powder coated on lithium surface"

(Patent Document 2) Korean Patent Application Laid-Open Publication No. 10-2013-0043117 "Lithium ion secondary battery"

DISCLOSURE

Technical Problem

As described above, existing lithium secondary batteries aim to resolve problems of stability and performance decline caused by lithium dendrite formed on an electrode surface during charge and discharge. As a result of extensive studies in view of the above, the inventors of the present invention have identified lithium dendrite formation is suppressed and lifetime properties may be improved when forming a lithium nitride ($Li_3N$) thin film layer and a carbon-based thin film layer on a lithium metal layer, and have completed the present invention.

Accordingly, an aspect of the present invention provides a negative electrode for a lithium secondary battery including a lithium nitride thin film layer and a carbon-based thin film layer on a lithium metal layer, a method for preparing the same, and a lithium secondary battery including the same.

Technical Solution

According to an aspect of the present invention, there is provided a negative electrode for a lithium secondary battery including a lithium metal layer, a lithium nitride layer formed on at least one surface of the lithium metal layer, and a carbon-based layer formed on the lithium nitride layer.

Herein, the lithium nitride layer may have a thickness of 10 nm to 300 nm.

Herein, the carbon-based layer may have a thickness of 10 nm to 300 nm.

Herein, the lithium nitride layer may have a porosity of 30% or less.

Herein, the carbon-based layer may include amorphous carbon, low crystalline carbon or a mixture thereof.

The carbon-based layer may have a specific surface area of 50 $m^2/g$ or greater.

According to another aspect of the present invention, there is provided a method for preparing a negative electrode for a lithium secondary battery including forming a lithium nitride film layer on at least one surface of a lithium metal layer; and forming a carbon-based layer on the lithium nitride layer.

Herein, the carbon-based layer may be deposited on the lithium nitride layer using one or more methods selected from the group consisting of sputtering, evaporation, chemical vapor deposition (CVD), physical vapor deposition (PVD), atomic layer deposition (ALD) and arc discharge.

Herein, heat treating the carbon-based layer may be further included.

According to still another aspect of the present invention, there is provided a lithium secondary battery including the negative electrode.

Advantageous Effects

According to the present invention, a lithium nitride thin film layer and a carbon-based thin film layer formed on a lithium metal layer obtains current density distribution uniformly by blocking side reactions caused by a direct contact between the lithium metal layer and an electrolyte as well as increasing a specific surface area of a negative electrode, and enhances cycle performance and reduces an overvoltage by suppressing lithium dendrite formation to improve electrochemical performance of a lithium secondary battery.

DESCRIPTION OF DRAWINGS

FIG. 1 is a schematic diagram of a negative electrode for a lithium secondary battery according to one embodiment of the present invention.

FIG. 2 is a schematic view presenting an operation principle during charge and discharge of a lithium secondary battery including a negative electrode using a lithium nitride thin film layer and a carbon-based thin film layer according to the present invention.

FIG. 3 is a graph presenting charge and discharge capacity with a cycle progress of lithium secondary batteries according to Example 1 and Comparative Examples 1-1 to 1-3 of the present invention.

FIG. 4 is a graph presenting Coulombic efficiency with a cycle process of lithium secondary batteries according to Example 1 and Comparative Examples 1-1 to 1-3 of the present invention.

FIG. 5 is a graph presenting a charge and discharge overvoltage behavior of lithium secondary batteries according to Example 2 and Comparative Examples 2-1 to 2-3 of the present invention.

BEST MODE

Hereinafter, the present invention will be described in detail so that those skilled in the art may readily implement the present invention. However, the present invention may be implemented in various different forms, and is not limited to the present specification.

In the drawings, parts not relevant to the descriptions are not included in order to clearly describe the present invention, and like reference numerals are used for like elements throughout the specification. In addition, sizes and relative sizes of constituents presented in the drawings are unrelated to actual scales, and may be reduced or exaggerated for clarity of the descriptions.

FIG. 1 is a diagram presenting a negative electrode (110) according to one embodiment of the present invention.

When referring to FIG. 1, a lithium nitride thin film layer (112) and a carbon-based thin film layer (113) are formed on a lithium metal layer (111) in a negative electrode (110) for a lithium secondary battery (110)battery of the present invention. In the drawing, the lithium nitride thin film layer (112) and the carbon-based thin film layer (113) are formed on only one surface of the lithium metal layer (111), but they may be formed on both surfaces.

Lithium Metal Layer

The lithium metal layer (111) according to the present invention may be a lithium metal plate, or a metal plate having an active layer including a lithium metal thin film or lithium formed on a negative electrode current collector. This means an active material layer in all ranges capable of forming lithium dendrite on the surface, and examples thereof may be one type selected from the group consisting of lithium metal, lithium alloys, lithium metal composite oxides, lithium-containing titanium composite oxides (LTO) and combinations thereof. The lithium alloy includes elements capable of alloying with lithium, and herein, the elements may be Si, Sn, C, Pt, Ir, Ni, Cu, Ti, Na, K, Rb, Cs, Fr, Be, Mg, Ca, Sr, Sb, Pb, In, Zn, Ba, Ra, Ge, Al, or an alloy thereof.

Specifically, lithium metal or a lithium alloy producing lithium dendrite by battery charge and discharge may be included, and more specifically, lithium metal may be included.

The lithium metal layer (111) may be a sheet or foil, and, in some cases, may have a form of depositing or coating lithium metal or lithium alloy on a current collector using a dry process, or may have a form of depositing or coating particulate metal and alloy using a wet process.

Herein, the method of forming the lithium metal layer (111) is not particularly limited, and known metal thin film forming methods such as a lamination method or a sputtering method may be used. In addition, assembling a battery with no lithium thin film on a current collector and then forming a metal lithium thin film on a metal plate by initial charge also belongs to the lithium metal layer (111) of the present invention.

The negative electrode active material including the lithium in another active layer form instead of a thin film form is commonly prepared by a certain coating process by preparing to a slurry mixture and coating the mixture on a negative electrode current collector.

The lithium metal layer (111) may have its width adjusted depending on the form of an electrode so that the electrode is readily prepared. The lithium metal layer (111) may have a thickness of 1 μm to 500 μm, preferably 10 μm to 350 μm, and more specifically 50 μm to 200 μm. When the thickness of the lithium metal layer is outside the range of 1 μm to 500 μm, it is not able to help with dendrite growth suppression, and may become a layer functioning as a resistor.

In addition, the lithium metal layer (111) may further include a current collector on one side, and specifically, the lithium metal layer may further include a current collector on one surface not adjoining a lithium nitride ($Li_3N$) thin film layer to describe later. Specifically, the lithium metal layer (111) may be a negative electrode, and herein, a negative electrode current collector may be used as the current collector.

The negative electrode current collector is not particularly limited as long as it has high conductivity without inducing chemical changes to a battery, and may be selected from the group consisting of copper, aluminum, stainless steel, zinc, titanium, silver, palladium, nickel, iron, chromium, alloys thereof and combinations thereof. The stainless steel may have its surface treated with carbon, nickel, titanium or silver, and aluminum-cadmium alloys may be used as the alloy, and in addition thereto, baked carbon, nonconductive polymers of which surface is treated with a conductor, conductive polymers or the like may also be used. A copper thin plate is generally used as the negative electrode current collector. In addition, as the form, various forms such as films with/without micro-unevenness formed on the surface, sheets, foil, nets, porous bodies, foams and non-woven fabrics may be used.

In addition, as the negative electrode current collector, those having a thickness range of 3 μm to 500 μm are used. When the negative electrode current collector has a thickness of less than 3 μm, a current collecting effect decreases, and the thickness being greater than 500 μm has a problem of processability decline when assembling a cell through folding.

FIG. 2 is a schematic view presenting an operation principle during charge and discharge of a lithium secondary battery including a negative electrode (110) for a lithium secondary battery including a lithium nitride thin film layer (112) and a carbon-based thin film layer (113) on the lithium metal layer (111) according to the present invention.

Using lithium metal as a negative electrode generally has problems as follows. First, lithium explosively reacts with water as an alkali metal and therefore is difficult to prepare and use under general environments. Second, when using lithium as a negative electrode, the lithium reacts with an electrolyte or water, impurities in the battery, lithium salts and the like to produce a passivation layer, and this layer causes a local current density difference forming dendritic lithium dendrite. In addition, the dendrite formed as above grows, passes between voids of a separator and may produce a direct internal short circuit with a positive electrode causing battery explosion. Third, lithium is a soft metal and has weak mechanical strength, and its handling property is very poor to use without additional surface treatment.

In view of the above, by forming a lithium nitride thin film layer (112) on the surface of the lithium metal layer (111), the present invention may facilitate simple handling and prevent a decrease in the ion conductivity through blocking lithium metal reactivity under an electrode preparation environment, and by forming a carbon-based thin film layer (113) thereon, may prevent passivation layer formation and dendrite formation and supplement mechanical strength.

Lithium Nitride ($Li_3N$) Thin Film Layer

The lithium nitride thin film layer (112) according to the present invention may be formed on both an upper surface and a lower surface of the lithium metal layer (111) described above, or formed only one surface facing an electrolyte layer. When the lithium nitride thin film layer (112) is not formed, lithium metal is oxidized due to reasons such as being exposed to moisture in the air, and forms $Li_2O$ during the formation of a carbon-based thin film layer (113) to describe later, which may decrease ion conductivity. In view of the above, forming the lithium nitride thin film layer (112) in the present invention is normally for preventing an electrode oxidation. Accordingly, the thickness of the lithium nitride thin film layer (112) is sufficient as long as it is formed enough to prevent an oxidation of the lithium metal layer (111) surface caused by an exposure to moisture or air. The thickness being too large causes an unnecessary increase in the electrode thickness, and the thickness may be from 10 nm to 300 nm, specifically from 50 nm to 200 nm, and more specifically from 50 nm to 150 nm.

The lithium nitride thin film layer (112) of the present invention has high ion conductivity and thereby does not induce battery reaction resistance, and is chemically stable for lithium metal and an electrolyte liquid. In addition, the lithium nitride thin film layer (112) may be uniform, continuous, and practically amorphous and non-porous. The lithium nitride thin film layer (112) is preferably non-porous, and preferably has porosity of 30% or less. The porosity being greater than 30% is not preferred since surface uniformity decreases.

The lithium nitride thin film layer (112) may be formed by depositing lithium on the lithium metal layer (111) surface under nitrogen atmosphere.

Examples of the method of forming the lithium nitride thin film layer (112) may include various deposition methods such as an electron beam deposition method, an organometal chemical vapor deposition method, reactive sputtering, a high frequency sputtering method and a magnetron sputtering method, and specifically, reactive sputtering may be included.

Carbon-Based Thin Film Layer

The carbon-based thin film layer (113) according to the present invention is formed on the lithium nitride thin film layer (112) described above, and reacts with inactive lithium or lithium dendrite that is not involved in charge and discharge on the negative electrode (110) to absorb lithium dendrite using a method of forming a lithium-intercalated material and the like. Accordingly, an internal short circuit of a battery is prevented, and cycle lifetime properties are enhanced during charge and discharge.

When the carbon material, a lithium dendrite-absorbing material, aggregates by being brought into contact with each other, a conductive network is formed, and accordingly, the conductive network is charged first before charging the negative electrode. As a result, the amount of dendrite absorption decreases causing decline in the battery cycle properties. Accordingly, it is preferred that the carbon material, a lithium dendrite-absorbing material, be uniformly distributed.

The carbon-based thin film layer (113) may include amorphous carbon, low crystalline carbon or a mixture thereof, and may have a specific surface area of 50 $m^2/g$ or greater. In addition, the specific surface area may be preferably from 50 $m^2/g$ to 100 $m^2/g$, and when the specific surface area is greater than 100 $m^2/g$, the portion capable of reacting with an electrolyte liquid becomes too wide generating an irreversible reaction, which is not preferred in terms of charge and discharge efficiency or battery capacity.

When the carbon-based thin film layer (113) includes high crystalline carbon, the specific surface area becomes small and current density may not be uniformly distributed, and the specific surface area being less than 50 $m^2/g$ may have a problem in that lithium ion flux is not smooth.

The carbon material that may be included in the carbon-based thin film layer (113) is hard carbon, soft carbon or the like, but is not limited thereto.

The carbon-based thin film layer (113) according to the present invention is formed to have a thickness of 10 nm to 300 nm, preferably 50 nm to 250 nm, more preferably 100 nm to 200 nm, and most preferably 120 nm to 170 nm. When the carbon-based thin film layer (113) has a thickness of less than 10 nm, the role of a protective layer is not properly performed causing cracks, and the thickness being greater than 300 nm has a problem of reducing energy density by increasing a thickness of the whole negative electrode.

The carbon-based thin film layer (113) according to the present invention may be prepared by employing a method of dry deposition. Compared to a wet deposition method, such a dry deposition method may increase purity of the carbon material included in the carbon-based thin film layer since additional materials such as a binder are not added, and may widen a surface area and exhibit current density distribution uniformly since high porosity is evenly provided on the deposited carbon-based thin film layer.

Nonlimiting examples of such a dry deposition method may include methods selected from the group consisting of sputtering, an evaporation method, a chemical vapor deposition (CVD) method, a physical vapor deposition (PVD) method, an atomic layer deposition (ALD) method, arc discharge and combinations thereof, and specifically, a physical vapor deposition method is used.

Forming the carbon-based thin film layer (113) using the physical vapor deposition method is preferred since a uniform and thin carbon-based thin film layer may be formed.

In addition, the physical vapor deposition method is carried out for 20 minutes to 120 minutes, preferably for 40 minutes to 120 minutes, more preferably for 40 minutes to 100 minutes, and most preferably for 40 minutes to 60 minutes. When the deposition time is shorter than 20 minutes, the carbon-based thin film layer is too thin, and the role of a protective layer is not properly performed causing cracks, and the deposition time being longer than 120 minutes has a problem of reducing energy density by increasing a thickness of the carbon-based thin film layer.

After the deposition, a heat treatment process may be selectively performed as necessary. Herein, the heat treatment temperature may be 1200° C. Specifically, a heat treatment process by rapid thermal anneal having a temperature raising rate of 5° C./sec to 300° C./sec to a heat treatment temperature is preferred. Such a heat treatment process may induce uniform pore alignment through a self-assembly of deposited carbon particles.

After that, the negative electrode (110) having the lithium nitride thin film layer (112) and the carbon-based thin film layer (113) formed on the lithium metal layer (111) may be rolled. The rolling may be carried out using common methods, and for example, a method of rolling with a pressure roller provided in a roll press and the like, or rolling across the whole electrode surface using a plate press may be used. Particularly, such a rolling process may apply a pressure of 10 kg/cm$^2$ to 100 ton/cm$^2$, and heat with a temperature of 100° C. to 200° C. The heat treatment at the above-mentioned temperature includes heating while performing a rolling process, or performing a rolling process in a state heated before performing the rolling process as well.

Particularly, it is preferable that the lithium nitride thin film layer (112) and the carbon-based thin film layer (113) be consecutively laminated on the lithium metal layer (111) in the negative electrode (110) of the present invention. On the contrary, when the lamination structure has the carbon-based thin film layer (113) and the lithium nitride thin film layer (112) laminated in this order on the lithium metal layer (111), lithium ion flux of the carbon-based thin film layer (113) is not smooth, and uniform distribution of current density may be difficult.

Lithium Secondary Battery

In the lithium secondary battery according to the present invention, constitutions other than structures and properties of the negative electrode (110) described above may be prepared through known technologies implemented by those skilled in the art, and the constitutions will be specifically described hereinafter.

A positive electrode (120) according to the present invention may be prepared to a positive electrode (120) form by film-forming a composition including a positive electrode active material, a conductor and a binder on a positive electrode current collector.

The positive electrode active material may vary depending on the application of a lithium secondary battery, and known materials are used as the specific composition. As one example, the positive electrode active material may include any one lithium transition metal oxide selected from the group consisting of lithium cobalt-based oxides, lithium manganese-based oxides, lithium copper oxide, lithium nickel-based oxides, lithium manganese composite oxides and, lithium-nickel-manganese-cobalt-based oxides, and more specifically, may include lithium manganese oxides such as $Li_{1+x}Mn_{2-x}O_4$ (herein, x is 0 to 0.33), $LiMnO_3$, $LiMn_2O_3$ or $LiMnO_2$; lithium copper oxide ($Li_2CuO_2$); vanadium oxides such as $LiV_3O_8$, $LiFe_3O_4$, $V_2O_5$ or $Cu_2V_2O_7$; lithium nickel oxides represented by $LiNi_{1-x}M_xO_2$ (herein, M=Co, Mn, Al, Cu, Fe, Mg, B or Ga, and x=0.01 to 0.3); lithium manganese composite oxides represented by $LiMn_{2-x}M_xO_2$ (herein, M=Co, Ni, Fe, Cr, Zn or Ta, and x=0.01 to 0.1) or $Li_2Mn_3MO_8$ (herein, M=Fe, Co, Ni, Cu or Zn), lithium-nickel-manganese-cobalt-based oxides represented by $Li(Ni_aCo_bMn_c)O_2$ (herein, 0<a<1, 0<b<1, 0<c<1, a+b+c=1), $Fe_2(MoO_4)_3$; elemental sulfur, disulfide compounds, organosulfur protective layers (organosulfur compounds) and carbon-sulfur polymers $((C_2S_x)_n: x=2.5$ to 50, $n≥2$); graphite-based materials; carbon black-based materials such as Super-P, denka black, acetylene black, ketjen black, channel black, furnace black, lamp black, thermal black or carbon black; carbon derivatives such as fullerene; conductive fibers such as carbon fiber or metal fiber; fluorinated carbon, aluminum, metal powder such as nickel powder; conductive polymers such as polyaniline, polythiophene, polyacetylene or polypyrrole; forms supporting a catalyst such as Pt or Ru on a porous carbon support, or the like. However, the positive electrode active material is not limited thereto.

The conductor is a component for further enhancing conductivity of the positive electrode active material, and nonlimiting examples thereof may include graphite such as natural graphite or artificial graphite; carbon black such as carbon black, acetylene black, ketjen black, channel black, furnace black, lamp black or thermal black; conductive fibers such as carbon fiber or metal fiber; fluorinated carbon, aluminum, metal powder such as nickel powder; conductive whiskers such as zinc oxide or potassium titanate; conductive metal oxides such as titanium oxide; conductive materials such as polyphenylene derivatives, and the like.

The positive electrode (120) may further include a binder for binding of the positive electrode active material and the conductor and for binding on the current collector. The binder may include a thermoplastic resin or a thermosetting resin. For example, polyethylene, polypropylene, polytetrafluoroethylene (PTFE), polyvinylidene fluoride (PVDF), styrene-butadiene rubber, a tetrafluoroethylene-perfluoro alkylvinyl ether copolymer, a vinylidene fluoride-hexafluoropropylene copolymer, a vinylidene fluoride-chlorotrifluoroethylene copolymer, an ethylene-tetrafluoroethylene copolymer, a polychlorotrifluoroethylene, vinylidene fluoride-pentafluoropropylene copolymer, a propylene-tetrafluoroethylene copolymer, an ethylene-chlorotrifluoroethylene copolymer, a vinylidene fluoride-hexafluoropropylene-tetrafluoroethylene copolymer, a vinylidene fluoride-perfluoromethylvinyl ether-tetrafluoroethylene copolymer, an ethylene-acrylic acid copolymer and the like may be used either alone or as a mixture, however, the binder is not limited thereto, and those capable of being used as a binder in the art may all be used.

The positive electrode current collector is the same as described in the negative electrode current collector, and an aluminum thin plate may be generally used as the positive electrode current collector.

Such a positive electrode (120) may be prepared using common methods, and specifically, may be prepared by coating a composition for forming a positive electrode active material layer prepared by mixing a positive electrode active material, a conductor and a binder in an organic solvent on a current collector and drying the result, and selectively, compression molding the result on the current collector for enhancing electrode density. Herein, as the organic solvent, those capable of uniformly dispersing the positive electrode active material, the binder and the conductor, and readily evaporating are preferably used. Specifically, acetonitrile, methanol, ethanol, tetrahydrofuran, water, isopropyl alcohol and the like may be included.

The positive electrode (120) composition may be coated on the positive electrode current collector using common methods known in the art, and for example, various methods such as a dipping method, a spray method, a roll coat method, a gravure printing method, a bar coat method, a die coating method, a comma coating method or a mixed method thereof may be used.

The positive electrode (120) and the positive electrode (120) composition that have gone through such a coating process go through solvent or dispersion medium evaporation, compactness of the coating layer and adhesion between the coating layer and the current collector through a drying process afterward. Herein, the drying is carried out using a common method, and is not particularly limited.

A common separator (130) may be provided between the positive electrode (120) and the negative electrode (110). The separator (130) is a physical separator (130) having a function of physically separating electrodes, and those commonly used as a separator (130) may be used without particular limit, and particularly, those having an excellent electrolyte liquid moisture retention ability while having low resistance for ion migration of the electrolyte liquid are preferred.

In addition, the separator (130) enables lithium ion transfer between the positive electrode (120) and the negative electrode (110) while separating or insulating the positive electrode (120) and the negative electrode (110) from each other. Such a separator (130) may be formed with porous, and non-conductive or insulating materials. The separator (130) may be an independent member such as a film, or a coating layer added to the positive electrode (120) and/or the negative electrode (110).

Examples of the polyolefin-based porous membrane may include membranes formed with a polymer using a polyolefin-based polymer such as polyethylene such as high density polyethylene, linear low density polyethylene, low density polyethylene and ultra-high molecular weight polyethylene, polypropylene, polybutylene and polypentene alone, or formed with a polymer mixing these may be included.

As the non-woven fabric other than the polyolefin-based non-woven fabric described above, non-woven fabrics formed with a polymer using, for example, polyphenylene oxide, polyimide, polyamide, polycarbonate, polyethylene terephthalate, polyethylene naphthalate, polybutylene terephthalate, polyphenylene sulfide, polyacetal, polyether sulfone, polyetheretherketone, polyester and the like alone, or formed with a polymer mixing these may be used, and, as a fiber form forming a porous web, such a non-woven fabric includes a spunbond or meltblown form formed with long fibers.

The thickness of the separator (130) is not particularly limited, but is preferably in a range of 1 μm to 100 μm and more preferably in a range of 5 μm to 50 μm. When the separator (130) has a thickness of less than 1 μm, mechanical properties may not be maintained, and when the thickness is greater than 100 μm, the separator (130) functions as a resistive layer declining battery performance.

A pore size and porosity of the separator (130) are not particularly limited, however, the pore size is preferably from 0.1 μm to 50 μm, and the porosity is preferably from 10% to 95%. When the separator (130) has a pore size of less than 0.1 μm or porosity of less than 10%, the separator (130) functions as a resistive layer, and when the pore size is greater than 50 μm or the porosity is greater than 95%, mechanical properties may not be maintained.

The electrolyte liquid of the lithium secondary battery is a lithium-salt containing electrolyte liquid, and may be an aqueous or non-aqueous electrolyte liquid, is specifically a non-aqueous electrolyte formed with an organic solvent electrolyte liquid and a lithium salt. In addition thereto, an organic solid electrolyte, an inorganic solid electrolyte or the like may be included, however, the electrolyte liquid is not limited thereto.

As the lithium salt, those commonly used in an electrolyte liquid for a lithium secondary battery may be used without limit. For example, an anion of the lithium salt may include any one selected from the group consisting of $F^-$, $Cl^-$, $Br^-$, $I^-$, $NO_3^-$, $N(CN)_2^-$, $BF_4^-$, $ClO_4-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$, or two or more types among these.

As the organic solvent included in the non-aqueous electrolyte liquid, those commonly used in electrolyte liquids for a lithium secondary battery may be used without limit, and for example, ether, ester, amide, linear carbonate, cyclic carbonate and the like may be used either alone, or as a mixture of two or more types. Among these, a carbonate compound that is cyclic carbonate, linear carbonate or a mixture thereof may be typically included.

Specific examples of the cyclic carbonate compound may include any one selected from the group consisting of ethylene carbonate (EC), propylene carbonate (PC), 1,2-butylene carbonate, 2,3-butylene carbonate, 1,2-pentylene carbonate, 2,3-pentylene carbonate, vinylene carbonate, vinyl ethylene carbonate and halides thereof, or a mixture of two or more types thereof. Examples of the halides thereof may include fluoroethylene carbonate (FEC) and the like, but are not limited thereto.

Specific examples of the linear carbonate compound may typically include any one selected from the group consisting of dimethyl carbonate (DMC), diethyl carbonate (DEC), dipropyl carbonate, ethylmethyl carbonate (EMC), methylpropyl carbonate and ethylpropyl carbonate, or a mixture of two or more types thereof, but are not limited thereto.

Particularly, among the carbonate-based organic solvents, ethylene carbonate and propylene carbonate that are cyclic carbonate are a highly viscous organic solvent and have a high dielectric constant, and therefore, may more favorably dissociate a lithium salt in an electrolyte, and when mixing and using linear carbonate having low viscosity and low dielectric constant such as dimethyl carbonate and diethyl carbonate in a proper ratio to such cyclic carbonate, an electrolyte liquid having higher electrical conductivity may be prepared.

In addition, as the ether among the organic solvents, any one selected from the group consisting of dimethyl ether, diethyl ether, dipropyl ether, methylethyl ether, methylpropyl ether and ethylpropyl ether, or a mixture of two or more types thereof may be used, however, the ether is not limited thereto.

As the ester among the organic solvents, any one selected from the group consisting of methyl acetate, ethyl acetate, propyl acetate, methyl propionate, ethyl propionate, propyl propionate, γ-butyrolactone, γ-valerolactone, γ-caprolactone, σ-valerolactone and ε-caprolactone, or a mixture of two or more types thereof may be used, however, the ester is not limited thereto.

The non-aqueous electrolyte liquid may be injected at a proper stage in an electrochemical device manufacturing process depending on a manufacturing process and required properties of a final product. In other words, the non-aqueous electrolyte liquid may be injected at a stage prior to assembling an electrochemical device or at a final stage of electrochemical device assembly.

The lithium secondary battery according to the present invention may go through lamination (stack) and folding processes of a separator and an electrode in addition to winding, a general process. In addition, the battery case may be a cylinder-type, a square-type, a pouch-type, a coin-type or the like.

Herein, depending on the positive electrode (120) material and the separator (130) type, the lithium secondary battery may be divided into various batteries such as a lithium-sulfur battery, a lithium-air battery, a lithium-oxide battery or a lithium all-solid-state battery, and depending on the shape, may be divided into a cylinder-type, a square-type, a coin-type, a pouch-type and the like, and depending on the size, may be divided into a bulk type and a thin film type. Structures and manufacturing methods of these batteries are widely known in the art, and therefore, detailed descriptions thereon are not included.

The lithium secondary battery according to the present invention may be used as a power supply of devices requiring high stability. Specific examples of the device may include power tools operated through receiving electric power by a battery motor; electric vehicles including electric vehicles (EV), hybrid electric vehicles (HEV), plug-in hybrid electric vehicles (PHEV) and the like; electric two-wheeled vehicles including e-bikes, e-scooters and the like; electric golf carts; systems for power storage and the like, but are not limited thereto.

Hereinafter, the present invention will be described in detail with reference to examples in order to specifically describe the present invention. However, the examples according to the present specification may be modified to various different forms, and the scope of the present invention is not construed as being limited to the examples described below. The examples of the present invention are provided in order to more fully describe the present invention for those having average knowledge in the art.

PREPARATION EXAMPLE

Preparation of Negative Electrode

A lithium metal plate (thickness: 150 μm) was exposed to nitrogen ($N_2$) gas 0.1 Pa for 5 minutes in a vacuum chamber to form a lithium nitride ($Li_3N$) thin film layer (thickness: 100 nm) using a reactive sputtering method, and a carbon thin film layer (thickness: 150 nm) was continuously formed using a physical vapor deposition (PVD) method while leaving the lithium nitride thin film layer-formed lithium metal plate as it is in the reaction chamber to prepare a negative electrode.

Example 1

Manufacture of Lithium Secondary Battery

Lithium cobalt oxide (LCO) was used as a working electrode, and the electrode prepared in the above-mentioned preparation example was used as a counter electrode. After providing a polyolefin separator between the electrodes, an electrolyte liquid prepared by dissolving 1 M $LiPF_6$ in a solvent mixing ethylene carbonate (EC) and Diethyl carbonate (DEC) in a volume ratio of 50:50 was injected thereto to manufacture a battery.

Comparative Example 1-1

Manufacture of Lithium Secondary Battery

A lithium secondary battery was manufactured in the same manner as in Example 1 except that lithium metal having a thickness of 150 μm was used as the counter electrode.

Comparative Example 1-2

Manufacture of Lithium Secondary Battery

A lithium secondary battery was manufactured in the same manner as in Example 1 except that an electrode forming a lithium nitride thin film layer having a thickness of 100 nm by supplying nitrogen gas to lithium metal having a thickness of 150 μm was used as the counter electrode.

Comparative Example 1-3

Manufacture of Lithium Secondary Battery

A lithium secondary battery was manufactured in the same manner as in Example 1 except that an electrode formed by depositing a carbon-based thin film having a thickness of 150 nm for 60 minutes on lithium metal having a thickness of 150 μm was used as the counter electrode.

Example 2

Manufacture of Lithium Symmetric Cell

The negative electrode prepared in the above-mentioned preparation example was used each as a working electrode and a counter electrode. After providing a polyolefin separator between the electrodes, an electrolyte liquid prepared by dissolving 1 M $LiPF_6$ in a solvent mixing ethylene carbonate (EC) and Diethyl carbonate (DEC) in a volume ratio of 50:50 was injected thereto to manufacture a lithium symmetric cell.

Comparative Example 2-1

Manufacture of Lithium Symmetric Cell

A lithium symmetric cell was manufactured in the same manner as in Example 2 except that lithium metal having a thickness of 150 μm was used each as the working electrode and the counter electrode.

Comparative Example 2-2

Manufacture of Lithium Symmetric Cell

A lithium symmetric cell was manufactured in the same manner as in Example 2 except that an electrode forming a lithium nitride thin film layer having a thickness of 100 μm by supplying nitrogen gas to lithium metal having a thickness of 150 μm was used each as the working electrode and the counter electrode.

Comparative Example 2-3

Manufacture of Lithium Symmetric Cell

A lithium symmetric cell was manufactured in the same manner as in Example 2 except that an electrode formed by depositing a carbon-based thin film having a thickness of 150 μm for 60 minutes on lithium metal having a thickness of 150 μm was used each as the working electrode and the counter electrode.

Experimental Example 1

Measurement of Electrochemical Charge and Discharge Capacity, Lifetime (Cycle) Properties and Efficiency For the lithium secondary batteries of Example 1 and Comparative Examples 1-1 to 1-3, charge capacity and discharge capacity during a charge/discharge process were measured by employing a charging voltage of 4.4 V cut and a rate of 0.5 C, and a discharging voltage of 3.3 V cut and a rate of 0.5 C, and resulting lifetime properties are shown in the following Table 1 and FIG. 3. Capacity efficiency was calculated therethrough and the results are shown in FIG. 4.

TABLE 1

|  | Charge/Discharge Capacity Retention Rate (%) at $50^{th}$ Cycle | Charge/Discharge Capacity Retention Rate (%) at $100^{th}$ Cycle |
|---|---|---|
| Example 1 | 91.9 | 41.2 |
| Comparative Example 1-1 | 39.2 | 1.1 |
| Comparative Example 1-2 | 62.2 | 19.2 |
| Comparative Example 1-3 | 77.2 | 16.6 |

As shown in Table 1, FIG. 3 and FIG. 4, it was identified that having a charge/discharge capacity retention rate of 80% or greater at the $50^{th}$ cycle point was Example 1, and having a charge/discharge capacity retention rate of 40% or greater at the $100^{th}$ cycle point was Example 1. Accordingly, it was identified that Example 1 depositing both the lithium nitride thin film layer and the carbon-based thin film layer had a significantly higher charge/discharge capacity retention rate compared to Comparative Example 1-2 and Comparative Example 1-3 depositing only the lithium nitride thin film layer or the carbon-based thin film layer on lithium metal.

Experimental Example 2

Measurement of Electrochemical Charge and Discharge Overvoltage Behavior

For the lithium symmetric cells of Example 2 and Comparative Examples 2-1 to 2-3, an overvoltage behavior when Li plating/stripping was identified by repeating charge/discharge (current density 2 mA/cm²) by employing a charging voltage of 5 V cut and a charging time of 1 hour, and fixing a discharging voltage at −1 V cut and a discharging time at 1 hour, and the results are shown in FIG. 5.

As shown in FIG. 5, it was identified that Example 2 depositing both the lithium nitride thin film layer and the carbon-based thin film layer had a significantly decreased overvoltage compared to Comparative Example 2-2 and Comparative Example 2-3 depositing only the lithium nitride thin film layer or the carbon-based thin film layer on lithium metal.

REFERENCE NUMERAL

110: Negative Electrode
111: Lithium Metal Layer
112: Lithium Nitride Thin Film Layer
113: Carbon-Based Thin Film Layer
120: Positive Electrode
130: Separator

The invention claimed is:

1. A negative electrode for a lithium secondary battery comprising:
   a lithium metal layer;
   a lithium nitride layer formed on at least one surface of the lithium metal layer; and
   a carbon-based layer formed on the lithium nitride layer, wherein the carbon-based layer comprises amorphous carbon, low crystalline carbon or a mixture thereof, and wherein the carbon-based layer has a specific surface area of 50 m²/g or greater but less than 100 m²/g.

2. The negative electrode for a lithium secondary battery of claim 1, wherein the lithium nitride layer has a thickness of 10 nm to 300 nm.

3. The negative electrode for a lithium secondary battery of claim 1, wherein the carbon-based layer has a thickness of 10 nm to 300 nm.

4. The negative electrode for a lithium secondary battery of claim 1, wherein the lithium nitride layer has a porosity of 30% or less.

5. A method for preparing a negative electrode for a lithium secondary battery comprising:
   forming a lithium nitride layer on at least one surface of a lithium metal layer; and
   forming a carbon-based layer on the lithium nitride layer, wherein the carbon-based layer comprises amorphous carbon, low crystalline carbon or a mixture thereof, and wherein the carbon-based layer has a specific surface area of 50 m²/g or greater but less than 100 m²/g.

6. The method for preparing a negative electrode for a lithium secondary battery of claim 5, wherein the carbon-based layer is deposited on the lithium nitride layer using one or more methods selected from the group consisting of sputtering, evaporation, chemical vapor deposition (CVD), physical vapor deposition (PVD), atomic layer deposition (ALD) and arc discharge.

7. The method for preparing a negative electrode for a lithium secondary battery of claim 5, further comprising heat treating the carbon-based layer.

8. A lithium secondary battery comprising the negative electrode of claim 1.

9. The method for preparing a negative electrode for a lithium secondary battery of claim 6, wherein, after the carbon-based layer is deposited, a heat treatment process is performed at a temperature of at least 1200° C.

* * * * *